United States Patent
Splitthoff et al.

(10) Patent No.: US 11,630,177 B2
(45) Date of Patent: Apr. 18, 2023

(54) COIL MIXING ERROR MATRIX AND DEEP LEARNING FOR PROSPECTIVE MOTION ASSESSMENT

(71) Applicants: Siemens Healthcare GmbH, Erlangen (DE); The General Hospital Corporation, Boston, MA (US)

(72) Inventors: Daniel Nicolas Splitthoff, Uttenreuth (DE); Julian Hossbach, Erlangen (DE); Daniel Polak, Erlangen (DE); Stephen Farman Cauley, Somerville, MA (US); Bryan Clifford, Malden, MA (US); Wei-Ching Lo, Charlestown, MA (US)

(73) Assignees: Siemens Healthcare GmbH, Erlangen (DE); The General Hospital Corporation, Boston, MA (US)

( * ) Notice: Subject to any disclaimer, the term of this patent is extended or adjusted under 35 U.S.C. 154(b) by 0 days.

(21) Appl. No.: 17/719,916

(22) Filed: Apr. 13, 2022

(65) Prior Publication Data
US 2022/0342018 A1   Oct. 27, 2022

Related U.S. Application Data

(60) Provisional application No. 63/174,684, filed on Apr. 14, 2021.

(51) Int. Cl.
*G01R 33/54* (2006.01)
*G01R 33/56* (2006.01)

(52) U.S. Cl.
CPC ....... *G01R 33/546* (2013.01); *G01R 33/5608* (2013.01)

(58) Field of Classification Search
CPC .......................... G01R 33/546; G01R 33/5608
See application file for complete search history.

(56) References Cited

U.S. PATENT DOCUMENTS

| 2014/0210469 | A1* | 7/2014 | Cheng | G01R 33/56509 324/309 |
| 2016/0077180 | A1* | 3/2016 | Beck | G01R 33/56509 324/309 |
| 2020/0341100 | A1* | 10/2020 | Heukensfeldt Jansen | G01R 33/5608 |
| 2020/0341101 | A1 | 10/2020 | Splitthoff et al. | |
| 2021/0373105 | A1 | 12/2021 | Polak et al. | |

OTHER PUBLICATIONS

Bydder, Mark et al. "Detection and Elimination of Motion Artifacts by Regeneration of k-Space" Magnetic Resonance in Medicine, vol. 47, pp. 677-686, 2002 // DOI: 10.1002/mrm.10093.
Castella R. et al.:"Controlling motion artefact levels in MR images by suspending data acquisition during periods of head motion" Magn Reson Med. Dec. 2018; 80(6);2415-2426.

(Continued)

*Primary Examiner* — Gregory H Curran
(74) *Attorney, Agent, or Firm* — Lempia Summerfield Katz LLC

(57) ABSTRACT

Systems and Methods that identify the effect of motion during a medical imaging procedure. A neural network is trained to translate motion induced deviations of a coil-mixing matrix relative to a reference acquisition into a motion score. This score can be used for the prospective detection of the most corrupted echo trains for removal or triggering a replacement by reacquisition.

20 Claims, 8 Drawing Sheets

(56) References Cited

OTHER PUBLICATIONS

Dold C. et al.: "Advantages and Limitations of Prospective Head Motion Compensation for MRI Using an Optical Motion Tracking Device"; Academic Radiology, Reston, VA, US; Vo. 13; No. 9; pp. 1093-1103; XP028012632; ISSN: 1076-6332; DOI:10.1016/J.ACRA.2006.05.010;; 2006.

Duerk J. et al.:"A simulation study to assess SVD encoding for interventional MRI: effect of object rotation and needle insertion" J Magn Reson Imaging. 1996; 6(6); 957-960.

Haskell, M. W. et al. "Targeted Motion Estimation and Reduction (TAMER): Data Consistency Based Motion Mitigation for MRI using a Reduced Model Joint Optimization" IEEE, vol. 37, Nr. 5, pp. 1253-1265, 2018 // DOI 10.1109/TML2018.2791482.

Haskell, Melissa W. et al."Network Accelerated Motion Estimation and Reduction (NAMER): Convolutional neural network guided retrospektive motion correction using a separable motion model", Magn. Reson. Med, vol. 82, pp. 1452-1461, 2019// DOI: 10.1002/mrm.27771.

Kurucay K. et al.:"Analysis of SVD encoded imaging in the presence of inplane motion" ISMRM 1995; 755.

Lee et al.:"Deep Learning in MR Motion Correction: a Brief Review and a New Motion Simulation Tool (view2Dmotion)" Investigative Magnetic Resonance Imaging. 24. 196. 10.13104/imri.2020.24.4.196.

Loktyushin A, Nickisch H, Pohmann R, Schölkopf B. "Blind multirigid retrospective motion correction of MR images." Magn Reson Med. 2015;73(4):1457-1468. doi:10.1002/mrm.25266.; 2015.

Oksuz I. et al.:"Detection and Correction of Cardiac MR Motion Artefacts during Reconstruction from K-space". Proc MICCAI 2019; 695-703.

Oin, Lei et al. "Prospective Head-Movement Correction for High-Resolution MRI Using an In-Bore Optical Tracking System" Magnetic Resonance in Medicine; vol. 62, pp. 924-934 (2009).

Sachs T., Meyer C. et al."Real-Time Motion Detection in Spiral MRI Using Navigators", MRM 1994 32(5): S. 639-645; 1994.

Tisdall, Dylan M. et al. "Volumetric navigators for prospective motion correction and selective reacquisition in neuroanatomical MRI" Magnetic Resonance in Medicine, vol. 68, No. 2, pp. 389-399, Aug. 2012 // https://doi.org/10.1002/mrm.23228.

Zaitsev, Maxim et al.: "Motion Artifacts in MRI: A Complex Problem With Many Partial Solutions"; in: Journal of Magnetic Resonance Imaging; vol. 42; Issue 4; pp. 887-901; 2015; DOI: 10.1002/jmri.24850.

Zhang, Jialong et al: "Protecting Intellectual Property of Deep Neural Networks with Watermarking", in: ASIA CCS 18: Proceedings of the 2018 on Asia Conference on Computer and Communications Security, pp. 159-172, DOI: ttps://doi.org/10.1145/3196494.3196550, May 2018.

Zhang, Tao et al. "Coil Compression for Accelerated Imaging with Cartesian Sampling" Magnetic Resonance in Medicine, vol. 69, No. 2, pp. 571-582, Feb. 2013 // https://doi.org/10.1002/mrm.24267.

\* cited by examiner

COIL MIXING ERROR MATRIX AND DEEP LEARNING FOR PROSPECTIVE MOTION ASSESSMENT

CROSS REFERENCE TO RELATED APPLICATIONS

This patent document claims the benefit of the filing date under 35 U.S.C. § 119(e) of U.S. Provisional Patent Application Ser. No. 63/174,684 filed on Apr. 14, 2021, which is hereby incorporated in its entirety by reference.

FIELD

The present embodiments relate to prospective motion assessment during a medical imaging procedure.

BACKGROUND

Motion during the acquisition of magnetic resonance (MR) images may result in image artifacts and may lower the image quality. This may lead to misinterpretation by physicians or a useless image. Attempts have been made to correct motion by using additional equipment or to analyze and adjust the results after the procedure. Existing methods have various drawbacks such as poorer results, requiring additional equipment, or being performed after the procedure and thus less useful.

SUMMARY

In a first aspect, a method is provided for prospective or retrospective motion identification during an acquisition of magnetic resonance (MR) images of a patient by an imaging system, the method comprising: acquiring a motion free reference; calculating, based on the motion free reference, a first coil mixing matrix representing a linear combination of coils of the imaging system; applying the scout coil mixing matrix to the motion free reference to generate a linearly combined reference data; acquiring MR data for the patient from the imaging system and applying the first coil mixing matrix to the MR data to generate linearly combined motion data; determining a second coil mixing matrix for a respective subset of MR data based on the linearly combined motion data; inputting the second coil mixing matrix into a neural network trained to output a motion assessment for the acquired MR data; providing the motion assessment generated by the neural network to an operator.

In a second aspect, a method is provided for prospective or retrospective motion identification during an acquisition of magnetic resonance (MR) images of a patient by an imaging system, the method comprising: acquiring a motion free reference; calculating, based on the motion free reference, a scout coil mixing matrix representing a linear combination of coils of the imaging system; acquiring MR data for the patient from the imaging system and applying the scout coil mixing matrix to the MR data to generate linearly combined motion data; calculating a second coil mixing matrix for a respective subset of MR data based on the linearly combined motion data; calculating a difference coil mixing error matrix for a respective subset of MR data based on the difference of the scout coil mixing matrix and the second coil mixing matrix; inputting the difference coil mixing error matrix into a neural network trained to output a motion assessment for the acquired MR data; and providing the motion assessment generated by the neural network to an operator.

In a third aspect, a system is provided for prospective motion identification during an acquisition of magnetic resonance data of a patient. The system includes a magnetic resonance imaging system, a processor, a neural network, and an output device. The magnetic resonance imaging system is configured to acquire motion free reference data and magnetic resonance data. The processor is configured to calculate, based on the motion free reference data, a scout coil mixing matrix and to calculate, based on the scout coil mixing matrix and the magnetic resonance data, a coil mixing error matrix, a coil mixing matrix, or the coil mixing error matrix and the coil mixing matrix. The neural network is configured to output a motion assessment when input the coil mixing error matrix, the coil mixing matrix, or the coil mixing error matrix and the coil mixing matrix. The output device is configured to output the motion assessment from the neural network during an imaging procedure for the acquisition of the magnetic resonance data.

Any one or more of the aspects described above may be used alone or in combination. These and other aspects, features and advantages will become apparent from the following detailed description of preferred embodiments, which is to be read in connection with the accompanying drawings. The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the embodiments. Moreover, in the figures, like reference numerals designate corresponding parts throughout the different views.

DETAILED DESCRIPTION

Embodiments provide systems and methods for prospective or retrospective identification and/or quantification of motion during an MRI procedure. Embodiments assess the motion of a patient or object during the acquisition or MRI data by using the changes of the signal energy received by each coil, prospectively and/or retrospectively. A neural network is trained to learn the relationship between relative changes in the receiver coil energy distribution due to subject motion. Embodiments rapidly produce a motion score or motion parameters that may be used for the prospective adaption of the acquisition parameters, the generation of a warning for physicians indicating reacquisition might be beneficial, and/or initialization of other forms of retrospective correction.

Figure 1:
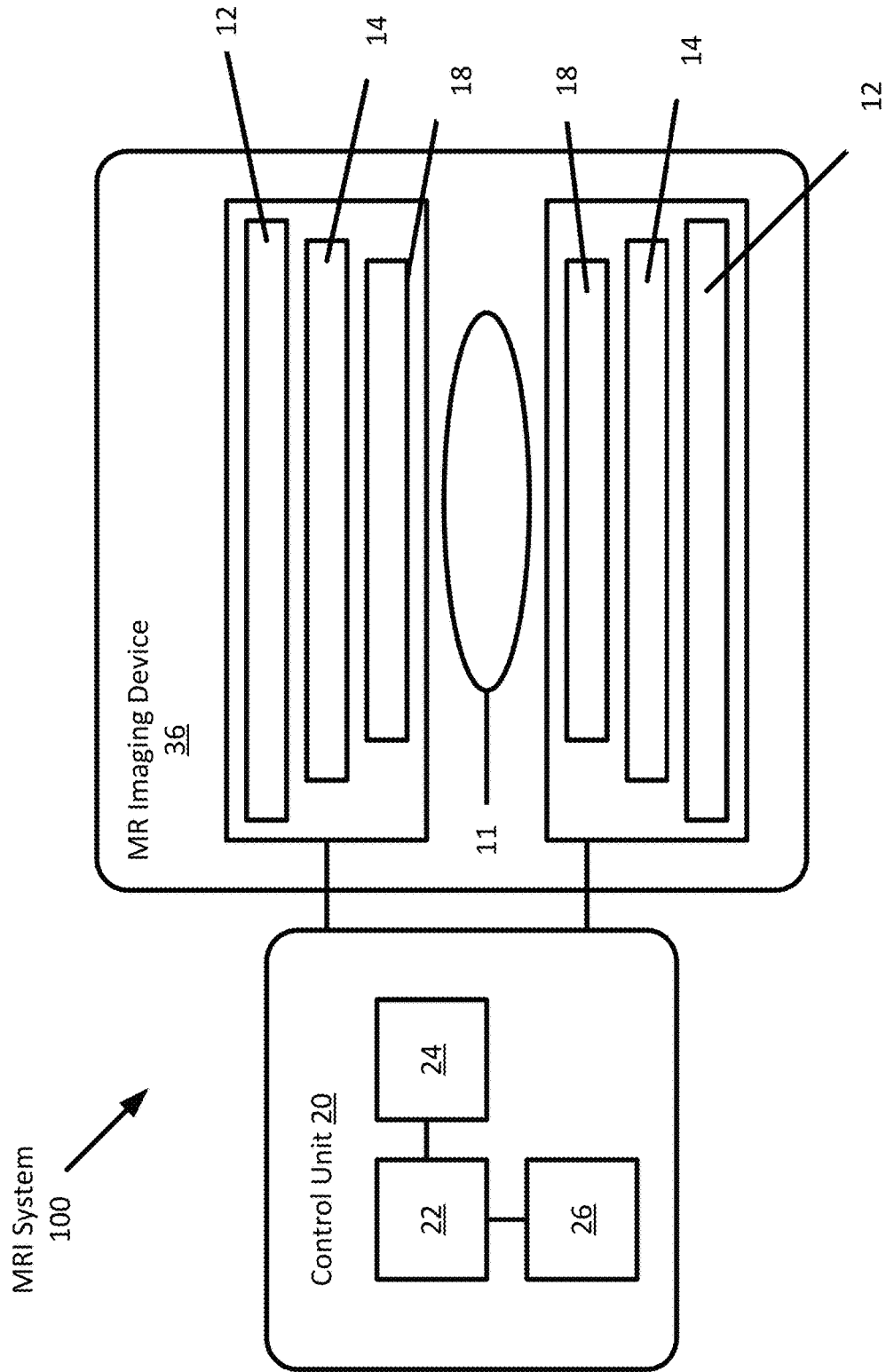
FIG. 1 depicts an example MR system.

FIG. 1 depicts an example MR system 100 that may be used for prospective motion identification during the acquisition of magnetic resonance (MR) images of a patient. The MR system 100 includes a control unit 20 configured to process the MR signals and generate images of a particular section of an object or patient 11 for display 26 to an operator. The control unit 20 may store the MR signals and images in a memory 24 for later processing or viewing. The control unit 20 may include a display 26 for presentation of images to an operator. The MR scanning system 100 is only exemplary, and a variety of MR scanning systems may be used to collect the MR data.

In the MR system 100, magnetic coils 12 create a static base or main magnetic field $B_0$ in the body of patient 11 or an object positioned on a table. Within the magnet system are gradient coils 14 for producing position dependent magnetic field gradients superimposed on the static magnetic field. Gradient coils 14, in response to gradient signals supplied thereto by a gradient and control unit 20, produce position dependent and shimmed magnetic field gradients in three orthogonal directions and generate magnetic field pulse sequences. The shimmed gradients compensate for inhomogeneity and variability in an MR imaging device magnetic field resulting from patient anatomical variation and other sources.

The control unit 20 includes a RF (radio frequency) module that provides RF pulse signals to RF coil 18. The RF coil 18 produces magnetic field pulses that rotate the spins of the protons in the imaged body of the patient 11 by ninety degrees or by one hundred and eighty degrees for so-called "spin echo" imaging, or by angles less than or equal to 90 degrees for "gradient echo" imaging. Gradient and shim coil control modules in conjunction with RF module, as directed by control unit 20, control slice-selection, phase-encoding, readout gradient magnetic fields, radio frequency transmission, and magnetic resonance signal detection, to acquire magnetic resonance signals representing planar slices of the patient 11.

In response to applied RF pulse signals, the RF coil 18 receives MR signals, e.g., signals from the excited protons within the body as the protons return to an equilibrium position established by the static and gradient magnetic fields. The MR signals are detected and processed by a detector within RF module and the control unit 20 to provide an MR dataset to a processor 22 for processing into an image. In some embodiments, the processor 22 is located in the control unit 20, in other embodiments, the processor 22 is located remotely. A two or three-dimensional k-space storage array of individual data elements in a memory 24 of the control unit 20 stores corresponding individual frequency components including an MR dataset.

One problem in MRI is that it is an intrinsically slow and sequential process. During the procedure, the object or patient must remain stationary, or motion artifacts may be generated. Motion artifacts may include blurring, streaking, shading, or other imaging issues that are not representative of the object being imaged. These errors lower the image quality and may lead to misinterpretation by physicians or a useless image. An expensive reacquisition of the whole scan may be required if the motion artifacts are too pronounced. Various types of motion by the object/patient may be exhibited. Various methods may also be used to prevent motion or correct motion artifacts in the image.

Motion by a patient or object typically takes the form of rigid body motion, elastic motion, and/or flow. Rigid body motion, or 'bulk motion,' includes one-dimensional translations, multi-dimensional translations, or completely unconstrained rigid motion. For example, diaphragm motion is sometimes approximated using a one-dimensional translation, but involuntary head motion normally requires six degrees of freedom. Elastic motion typically includes stretching, compression, and shearing along three axes, in addition to rigid body motion. Elastic motion may be observed in the abdomen, for example where various locations experience different displacements and deformations. Flow can in some cases be assumed to be one-dimensional, for example for laminar blood flow in small or medium-sized vessels or CSF flow in the cervical spine. Each of these types of motion may cause different types of artifacts with certain motions causing more issues. Assessing the type and extent of the motion is important for reducing the artifacts and/or correction of the artifacts.

Motion prevention is one method of suppressing motion artifacts. If motion can be avoided, then the effects are prevented and other, more complex, strategies such as motion correction become redundant. Unfortunately, preventing motion is not always practical and so artifact reduction or motion correction strategies are employed. Artifact reduction includes acquisition strategies that reduce artifacts in the resulting image or replace them with those with a less dramatic appearance. Motion correction involves the estimation and compensation of motion in the image(s).

One method for reducing motion artifacts is by using accelerated imaging techniques such as parallel imaging to acquire the data faster. Reducing the scan time can reduce the chance that motion will occur during the acquisition and thereby reduce the amount and degree of motion artifacts. However, the increased speed comes at the cost of other issues such as aliasing artifacts, limited spatial resolution, or increased noise-amplification (g-factor noise). Other methods for reducing motion artifacts include adjusting parameters of the scan. These methods include similar drawbacks in that using non-ideal parameters leads to lower quality images.

Motion correction, e.g., identifying and compensating for motion, may be performed prospectively or retrospectively (or both). Prospective motion correction or correction during the acquisition normally may be achieved by using navigators, external markers, and/or tracking systems to dynamically estimate motion during the scan and update acquisition parameters to compensate for the observed motion. As an example, a camera may be used to track or otherwise identify when motion occurs. Retrospective motion correction, i.e., correction after the acquisition, may be done by filtering the artifacts in the image domain (for example using simple linear filter or using a deep learning-based approach to identify artifacts) or incorporating estimated subject motion into the signal model. Retrospective motion correction may also be combined with motion measurement techniques based on navigators, external markers, and/or other motion tracking systems. Retrospective motion correction is useful for providing accurate images. However, retrospective motion correction, by its nature is performed after the fact. If an issue is uncovered, retrospective motion correction does not allow for reacquisition. For example, if motion is excessive, the motion correction may fail to provide a clear image and a completely new scan may be required.

In contrast to these approaches, embodiments described herein provide methods and systems that prospectively identify the effect of motion while not requiring additional hardware (e.g., a camera or other motion tracking system) or acquisition disruptions. Unlike existing methods for prospective motion estimation or assessment, the provided systems and methods do not require navigators or a signal model to identify or assess the motion, but instead use a neural network to learn the relationship between relative changes in receiver coil energy distribution due to subject motion. Embodiments are able to rapidly produce a motion assessment during the procedure that may be used for the prospective adaption of the acquisition parameters, the generation of a warning for physicians indicating reacquisition might be beneficial, and/or initialization of other forms of retrospective correction. Because embodiments do not require new hardware or new actions from an operator, the embodiments may be used with or in parallel with current systems and methods including current methods for motion correction. For example, while embodiments do not use motion detection mechanisms such as cameras, embodiments can work alongside other methods to improve the process and provide better and more accurate imaging and thus better results and conditions for patients and operators.

Figure 2:
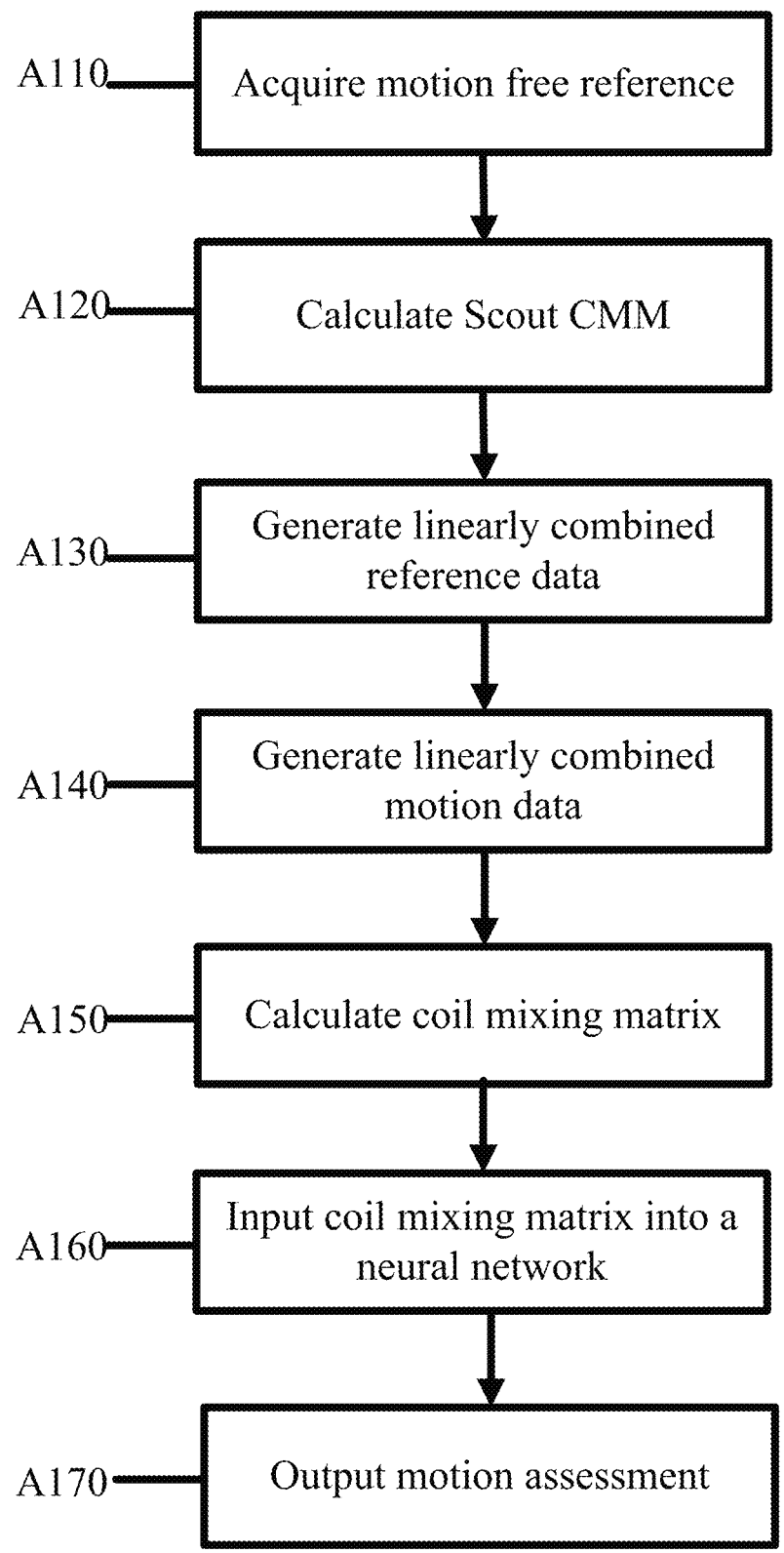
FIG. 2 depicts an example workflow for prospective motion identification during an acquisition of magnetic resonance data of a patient according to an embodiment.

FIG. 2 depicts a method for prospective motion identification during the acquisition of magnetic resonance images of a patient. An MRI procedure is performed on the patient. A motion assessment, for example a motion score and/or motion parameters, is provided as the scan progresses. Portions or the entirety of the imaging procedure may automatically be repeated, data may be replaced, and/or information may be provided to an operator about the identified motion. As presented in the following sections, the acts may be performed using any combination of the components indicated in FIG. 1, 3, or 5. The following acts may be performed by the MR system, control unit 20, processor 22, neural network, or a combination thereof. Additional, different, or fewer acts may be provided. The acts are performed in the order shown or other orders. In an example, act A110 may be performed prior to the definitive imaging procedure. This may include performing a scout scan to generate reference or baseline motion free data. The subsequent acts A120-A170 may be performed during the imaging procedure, so that, for example, the motion assessment may be used immediately to assess whether a new scan is required or if certain chunks/echo trains should be replaced. The acts may also be repeated. Certain acts may be skipped. In an embodiment, the coil mixing error matrix is not calculated. The neural network inputs the second coil mixing matrix and/or the coil mixing error matrix. In the event that there is no motion, the coil mixing error matrix may not be used.

The MRI system may be or may be similar to the MRI system depicted in FIG. 1. Alternative imaging systems or components may be included where applicable. In an embodiment, the control unit 20 includes at least a memory 24 and a processor 22 among other components. The processing of the motion free reference, coil mixing matrixes, and neural network may be performed onsite or in another location, for example, a cloud environment. The neural network may be trained at any point prior to applying the network. The output motion assessment may be used to retrain the neural network in order to further refine the output.

At Act A110, the control unit 20 identifies a motion free reference for the patient. The motion free reference may be acquired during a scout scan or may be identified from a previous scan. The motion free reference may be acquired from a parallel imaging reference scan needed for estimating the sensitivity maps or any other motion free scan. In normal practice, a preliminary, reference, or scout image may be taken of a body region before a definitive imaging study in order to establish a baseline, to make sure the region of interest is included in the field of view, or to check the exposure technique, among other reasons. Such a scan is typically quickly performed and thus may be able to acquire motion free reference data. Alternatively, the motion free reference may be acquired from or derived from a previous scan of the patient, object, or a different patient or object. The motion free reference data is k-space data. The data acquisition for MRI occurs not directly in image space, as is the case in photography, but rather in frequency or Fourier space, which is referred to as 'k-space.' K-space corresponds to the spectrum of the spatial frequencies of the imaged object and depending on the imaging situation may be two- or three-dimensional. In an example of motion free reference data, the scout scan provides a 64×64 patch of a motion-free k-space around the center.

At Act A120, the control unit 20 calculates, based on the motion free reference, a scout coil mixing matrix (Scout CMM) that represents a linear combination of coils of the imaging system. The scout CMM may also be a representation of the raw data from the scout scan or otherwise provided as the motion free reference data. In an embodiment, the raw data of the motion free reference is compressed using singular value decomposition (SVD) to reduce the dimensions of the raw data k∈C^N×C along the number of receiver coils C. SVD creates an orthonormal base of virtual coils, that spans the acquired data and sorts them descendent by their singular value i.e., their contribution. To determine this linear combination of the coils V∈C^C×C, a scout scan k_Ref is used. Alternative compression techniques may be used. The compression may be beneficial as it may help with the training and speed of the neural network as smaller inputs may be easier to process.

At act A130, the control unit 20 applies the scout CMM to the motion free reference to generate linearly combined reference data for a respective chunk or subset of the motion free reference data.

At Act A140, the control unit 20 acquires MR data for the patient and applies the scout CMM to the MR data to generate linearly combined motion data. Typically, when performing an MRI procedure, a patient or object is placed on the table, for example in the supine position. Receiver imaging coils are arranged around the part of interest (head, chest, knee, etc.). A protocol is selected by an operator. There are different protocols for different medical issues and clinical scenarios. A scout scan may be performed, as described above in Act A110. The scout scan may include, for example, a localizer scan that may be used for plotting slices or calibrating the MRI system. At this point the exact positions and angulation of slices are specified. Protocol parameters such as field-of-view, directions of phase- and frequency-encoding, slice thickness, can be modified at this point so they are optimized for the particular patient's anatomy. If saturation bands are required, these are also graphically positioned at this time. Once the slices and bands have been specified and parameters tweaked, the acquisition process begins. The output of the acquisition process is k-space data. The MR data may be acquired piece by piece, for example in a series of echo trains. These steps may be performed after each echo train has been received by the control unit 20. By performing these steps during the procedure, an operator may receive immediate feedback and if reacquisition is suggested, the procedure or portion of the procedure may be repeated immediately without delay.

The control unit 20 generates linearly combined motion data by applying the Scout CMM to the MR data. The result may be referred to as the CMM or second coil mixing matrix. The first coil mixing matrix/Scout CMM (the linear combination of the coils), calculated at Act A120, is applied to a current chunk of data produced by the MRI system. The properties of the linear combination ensure similarity of the resulting virtual coils across slices/subjects and may enforce properties like increased/decreased susceptibility for certain degrees of freedom of the patient movements (e.g., one virtual coil might be more susceptible to translation in x-direction and less for all other). In a case of no motion the reference and the to be investigated data have the same pose and the CMM or second coil mixing matrix may be used as input to the neural network. In the motion case, off-diagonal values emerge and are related to the changes in the coil loadings due to the motion. The coil mixing error matrix (CMEM) is calculated (below at act A150) based on a difference between the linearly combined motion data and the linearly combined reference by determining the linear combination of that error. Both matrices are calculated for the current chunk of the acquisition. The linear transform can be the SVD/PCA, which orthogonalizes the data. In an embodiment, the linear transform is not used. Instead, the coil mixing matrices and the coil mixing matrix error are based on the raw data.

In an embodiment, at Act A150, the control unit 20 determines or calculates a coil mixing matrix including either the CMM as described above or a coil mixing error matrix (also referred to as the difference coil mixing error matrix) for the respective chunk of MR data based on an error between the linearly combined motion data and the linearly combined reference data by determining the linear combination of the error. In certain embodiments, the control unit 20 only uses the CMM and thus the coil mixing error matrix may not be calculated (or may be calculated and not used as an input to the neural network). The coil mixing error matrix may be the difference between a subset of data from the motion free reference and from the definitive imaging procedure being performed and thus may be referred to as the difference coil mixing error matrix. In an embodiment, If $k_{Ref}$ forms a motion free subset of the motion affected k-space $k_{Mot}$, the coil mixing error matrix (CMEM) $V_{Err,s}$ may be calculated for any subset s, if $s \subset k_{Ref} \wedge s \subset k_{Mot}$: $k_{Ref,s} - k_{Mot,s} = USV_{Err,s}^{H}$. Apart from the motion intensity, the CMEM is affected by the object covered by the subset (k-space position, content) and the sensitivity maps.

Figure 3:
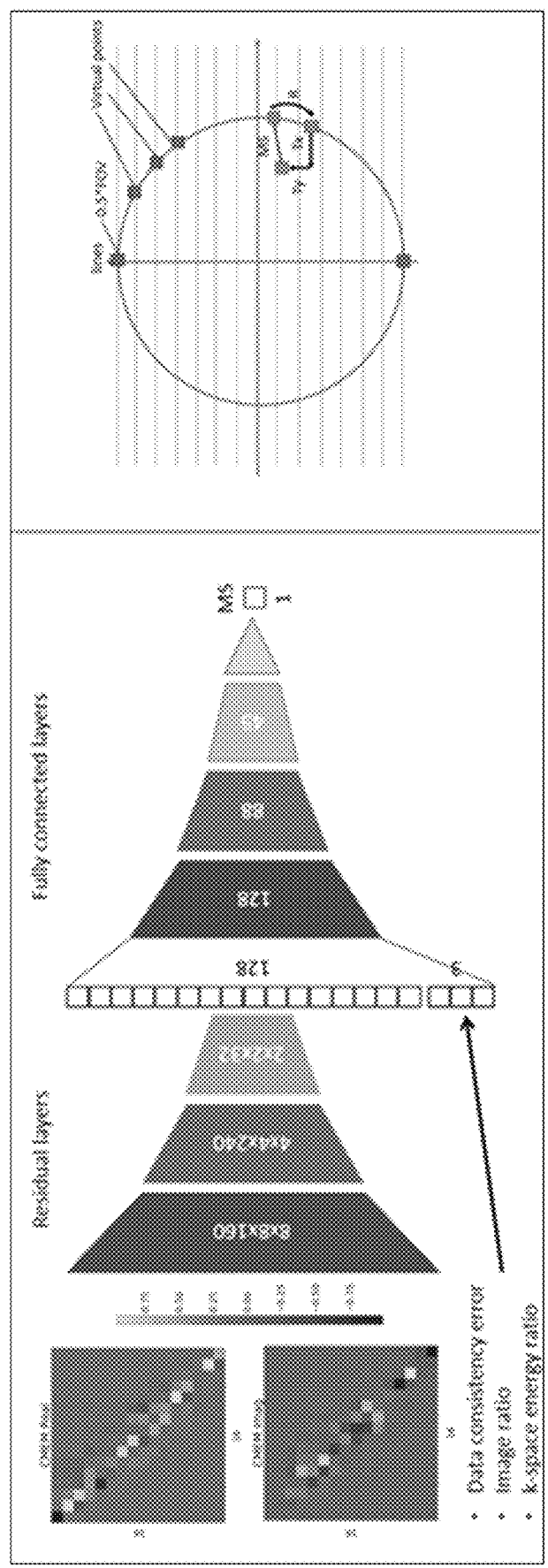
FIG. 3 depicts an example neural network trained to output a motion score according to an embodiment.

At Act A160, the control unit 20 inputs the coil mixing error matrix and/or the second coil mixing matrix (CMM) into a neural network trained to output a motion assessment for the acquired MRI data. Additional information may be input into the neural network when available. The additional information may include a data consistency error of the current ET, the object size relative to the image matrix size and the relative energy of the current ET to the whole. The additional information may help account for the differences in the depicted object. FIG. 3 depicts an example of a neural network that is used to generate a motion score when input the CMEM. FIG. 3 includes an example structure of the neural network on the left with respective output sizes and the visualization of the motion score (MS) on the right.

Different configurations for the neural network may be used. The neural network may be defined as a plurality of sequential feature units or layers. Sequential is used to indicate the general flow of output feature values from one layer to input to a next layer. Sequential is used to indicate the general flow of output feature values from one layer to input to a next layer. The information from the next layer is fed to a next layer, and so on until the final output. The layers may only feed forward or may be bi-directional, including some feedback to a previous layer. The nodes of each layer or unit may connect with all or only a sub-set of nodes of a previous and/or subsequent layer or unit. Skip connections may be used, such as a layer outputting to the sequentially next layer as well as other layers. Rather than pre-programming the features and trying to relate the features to attributes, the deep architecture is defined to learn the features at different levels of abstraction based on the input data. The features are learned to reconstruct lower-level features (i.e., features at a more abstract or compressed level). Each node of the unit represents a feature. Different units are provided for learning different features. Various units or layers may be used, such as convolutional, pooling (e.g., max pooling), deconvolutional, fully connected, or other types of layers. Within a unit or layer, any number of nodes is provided. For example, one hundred nodes are provided. Later or subsequent units may have more, fewer, or the same number of nodes. Unsupervised learning may also be used based on the distribution of the samples, using methods such as k-nearest neighbor.

Different neural network configurations and workflows may be used such as a convolution neural network (CNN), deep belief nets (DBN), or other deep networks. CNN learns feed-forward mapping functions while DBN learns a generative model of data. In addition, CNN uses shared weights for all local regions while DBN is a fully connected network (e.g., including different weights for all regions of a feature map. The training of CNN is entirely discriminative through backpropagation. DBN, on the other hand, employs the layer-wise unsupervised training (e.g., pre-training) followed by the discriminative refinement with backpropagation if necessary. In an embodiment, the arrangement of the neural network is a fully convolutional network (FCN). Other network arrangements may be used, for example, a 3D Very Deep Convolutional Networks (3D-VGGNet). VGG-Net stacks many layer blocks containing narrow convolutional layers followed by max pooling layers. A 3D Deep Residual Networks (3D-ResNet) architecture may be used. A Resnet uses residual blocks and skip connections to learn residual mapping. The neural network is configured to receive the complex valued CMEM as individual channels as well as the additional information. During training, the neural network is configured to minimize a L2 norm.

The training data for the model includes ground truth data or gold standard data acquired or simulated prior to training the neural network. Ground truth data and gold standard data is data that includes correct or reasonably accurate labels that are verified manually or by some other accurate method. The training data may be acquired at any point prior to inputting the training data into the neural network. The neural network may input the training data (e.g., CMM data, CMEM data and other information) and output a prediction or classification, for example of motion. In an example the prediction may include a motion score that quantifies the amount of motion in the input data. In another example, the prediction or classification may include motion parameters that quantify and describe the detected motion. The prediction is compared to the annotations (e.g., motion scores or values for respective degree of freedoms describing the 3D motion state of the patient at the time of the acquisition of a chunk of the data relative to an initial position) from the training data. A loss function may be used to identify the errors from the comparison. The loss function serves as a measurement of how far the current set of predictions are from the corresponding true values. Some examples of loss functions that may be used include Mean-Squared-Error, Root-Mean-Squared-Error, L2 norm, and Cross-entropy loss. Mean Squared Error loss, or MSE for short, is calculated as the average of the squared differences between the predicted and actual values. Root-Mean Squared Error is similarly calculated as the average of the root squared differences between the predicted and actual values. The L2 norm is similar to the Root-Mean Squared error and is calculated as the square root of the sum of the squared vector values. The max norm that is calculated as the maximum vector values. For cross-entropy loss each predicted probability is compared to the actual class output value (0 or 1) and a score is calculated that penalizes the probability based on the distance from the expected value. The penalty may be logarithmic, offering a small score for small differences (0.1 or 0.2) and enormous score for a large difference (0.9 or 1.0). During training and over repeated iterations, the neural network attempts to minimize the loss function as the result of a lower error between the actual and the predicted values means the neural network has done a good job in learning. Different optimization algorithms may be used to minimize the loss function, such as, for example, gradient descent, Stochastic gradient descent, Batch gradient descent, Mini-Batch gradient descent, among others. The process of inputting, outputting, comparing, and adjusting is repeated for a predetermined number of iterations with the goal of minimizing the loss function. Once adjusted and trained, neural network is ready to be applied to unseen data. In an embodiment, the neural network may be replaced by a model that uses, for example, a pattern matching technique. The model may be configured or trained using iterative machine learning techniques.

At Act A170, the control unit 20 provides the motion assessment generated by the neural network to an operator. A display 26 or other interface may be used to provide the motion assessment to the operator. The motion assessment may be used for the prospective adaption of the acquisition parameters, the generation of a warning for physicians indicating reacquisition might be beneficial, and/or initialization of other forms of retrospective correction. In an embodiment, the motion assessment is or includes a motion score that quantifies the extent of the motion. The motion score may be compared to a threshold score. If the motion score exceeds the threshold, e.g., indicating serious or severe motion, a warning may be provided to the operator so that the operator may elect to redo the scan (or the portion of the scan). In an embodiment, the control unit 20 ranks the motion scores for each echo train and replaces or reacquires the data for each of the n-th highest ranked echo trains or above a certain level. For example, the control unit 20 may replace the data for the worst 5, 10, or 20% of the acquired data among other levels.

The control unit 20 may also provide guidance for an operator, for example, a prediction as to whether a reacquisition of parts of the scan might be beneficial (i.e., there are data outliers due to patient motion). The control unit 20 may determine which parts of the acquisition will have the most malign influence on the image and might increase the image quality. Certain echo trains may be identified by the control unit 20 and options presented to the operator. In an embodiment, the control unit 20 may automatically (e.g., without operator input) attempt to reacquire certain portions based on high motion score.

In an embodiment, the motion assessment includes one or more values for respective degree of freedoms describing the 3D motion state of the patient at the time of the acquisition of a chunk of the data relative to an initial position. The initial position may be defined by a rapid motion-free initial scan and the patient's movements are quantified into different positions/poses after the sampling of the current chunk of the acquisition (e.g., echo train/shot/line of the k-space in multi-shot acquisitions).

Figure 4:
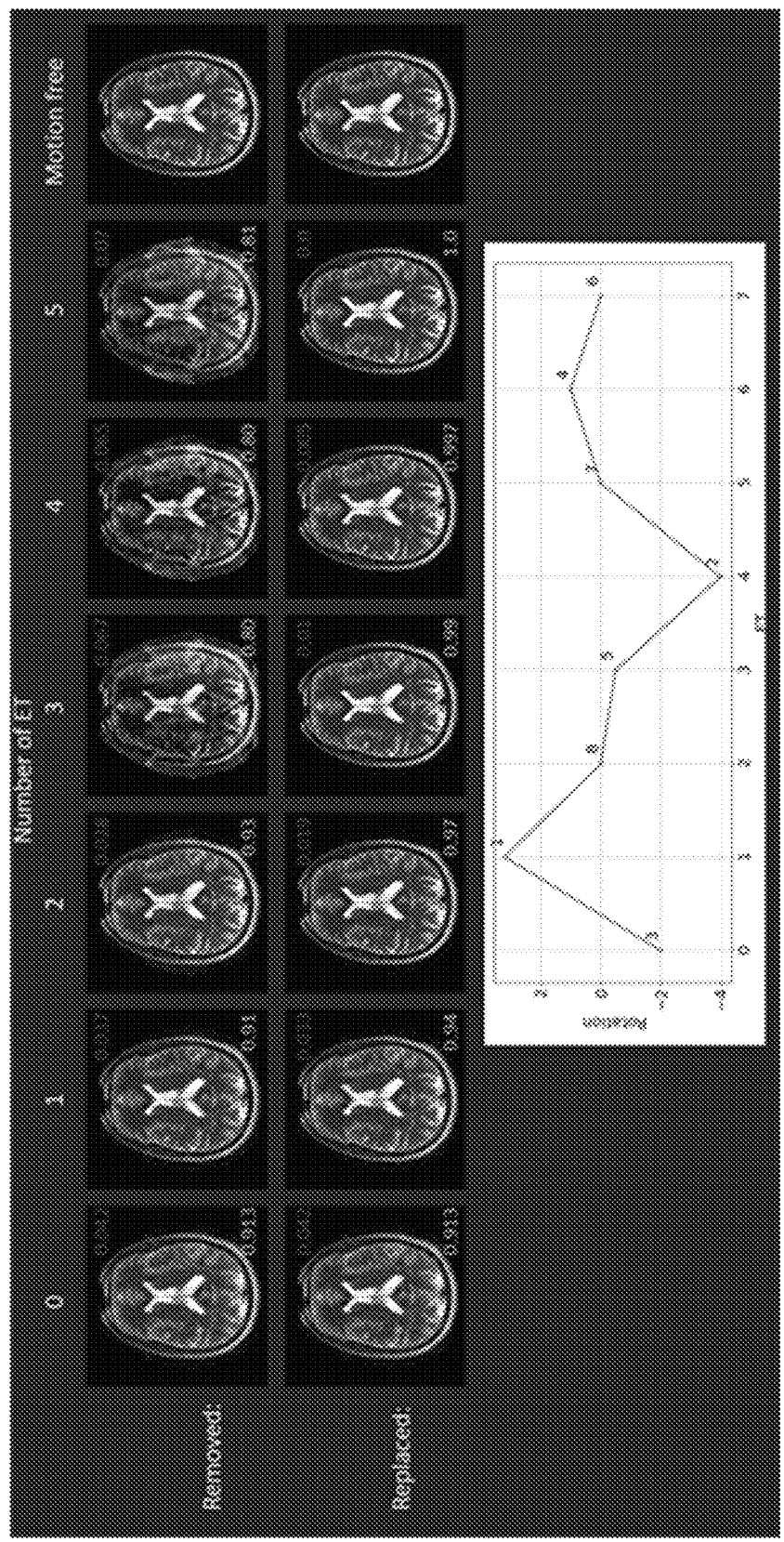
FIG. 4 depicts an example of output MR images that have been assigned a motion score according to an embodiment.

FIG. 4 depicts an example or the reconstruction of the motion corrupted k-space by removing or replacing the highest ranked ET by the neural network (RMSE: top—red; SSIM bottom—yellow). The curve in the plot below shows the ground truth motion; the numbers represent the ranking of the motion severity obtained by the neural network. For simplicity, only rotation is simulated in this example.

Additional post-processing may be required prior to outputting an image for analysis. After performing any post-processing such as retrospective motion correction, the control unit 20 outputs one or more images or volumes that are representative of the patient or object being scanned. Motion correction in MRI requires the synergy of pro- and retrospective approaches. Therefore, gathering insights on the patient's movements during the acquisition can reduce the prevalence of residual artifacts for retrospective methods. Apart from the prospective correction, knowledge on the motion severity can help physicians to react or benefit a retrospective artifact reduction. The use of prospective motion detection provides better results and potentially better outcomes for the patient, operator, and medical center.

Figure 5:
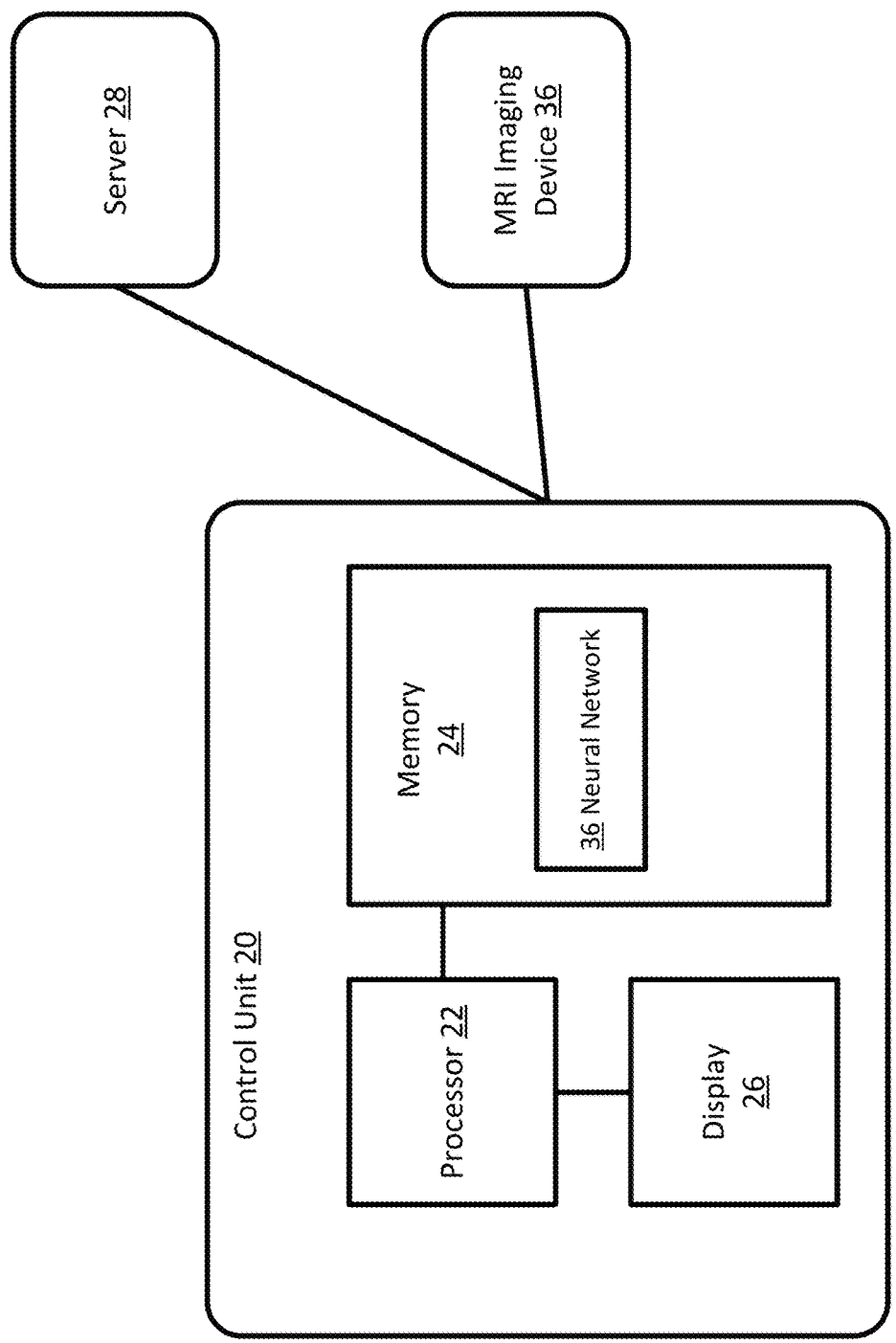
FIG. 5 depicts an example control unit of FIG. 1 according to an embodiment.

FIG. 5 depicts an example of a control unit 20 configured to prospectively provide a motion assessment during an MRI procedure. The control unit 20 includes at least a memory 24, a processor 22, and a display 26. The control unit 20 communicates with the MRI imaging device 36, for example, as described above in FIG. 1. The control unit 20 may also communicate with a server 28 or cloud-based computing environment, for example, to offload processing, store data, or access a neural network.

The processor 22 may be a general processor, central processing unit, control processor, graphics processing unit, digital signal processor, three-dimensional rendering processor, image processor, application specific integrated circuit, field programmable gate array, digital circuit, analog circuit, combinations thereof, or other now known or later developed device for processing medical imaging data. The processor 22 may be a single device or multiple devices operating in serial, parallel, or separately. The processor 22 may be a main processor of a computer, such as a laptop or desktop computer, or may be a processor for handling some tasks in a larger system, such as in a server 28 or in a cloud-based environment. The processor 22 is configured by instructions, design, hardware, and/or software to perform the acts discussed herein.

The processor is configured to train a Neural Network (NN) that prospectively scores the motion of subsets of the k-space, for which the motion is almost stationary, based on a coil mixing matrix (CMM) and/or a coil mixing error matrix (CMEM). The NN receives either a coil mixing matrix (CMM) and/or a coil mixing error matrix (CMEM) and optionally additional information on the current part of the acquisition. Both the CMM and CMEM, require certain properties. Based on a motion free reference, a first coil mixing matrix (linear combination of the coils), which fulfills the properties, is calculated, and applied to the current chunk of data, possibly affected by motion. The properties of the linear combination ensure similarity of the resulting virtual coils across slices/subjects and might enforce properties like increased/decreased susceptibility for certain degrees of freedom of the patient movements (e.g., one virtual coil might be more susceptible to translation in x-direction and less for all other).

Figure 6:
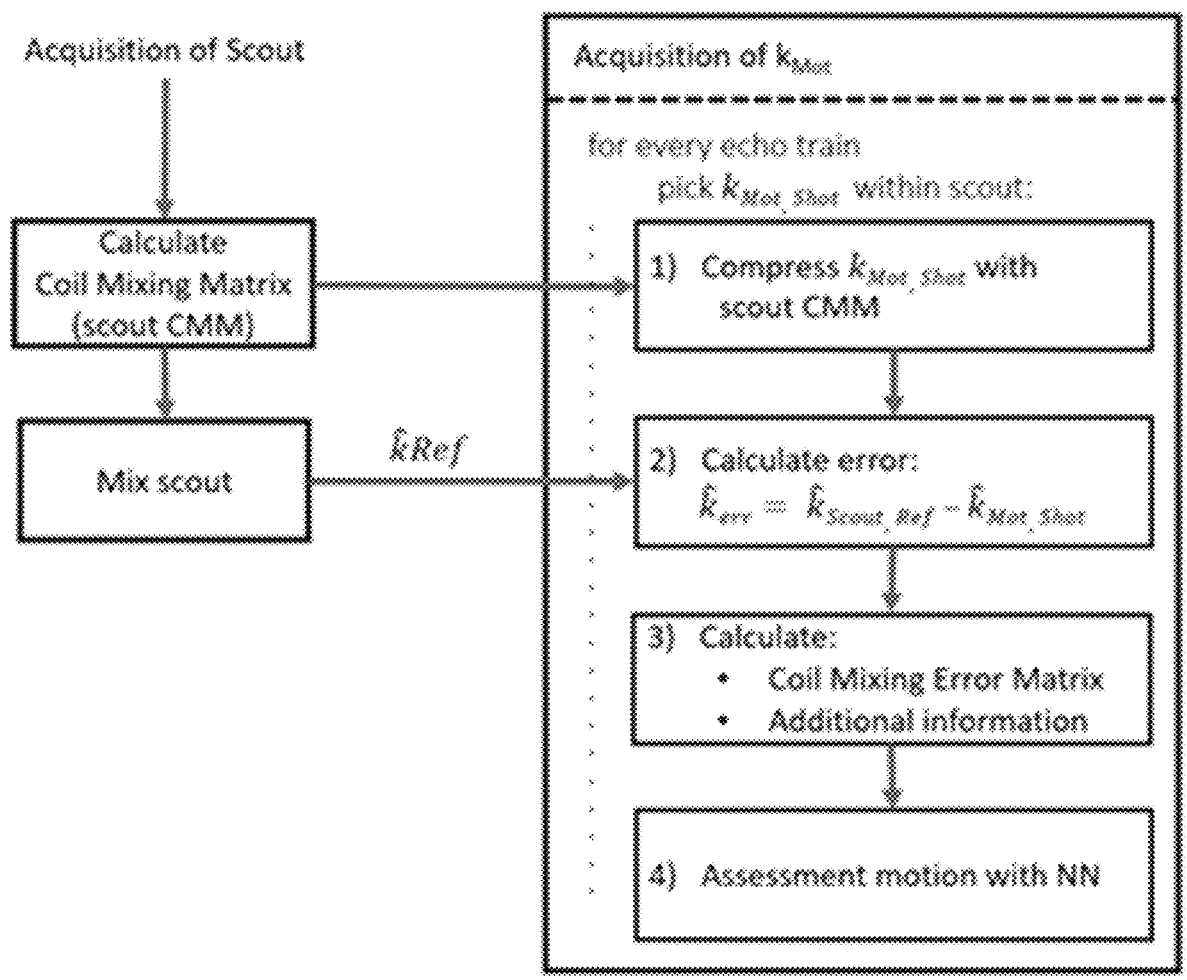
FIG. 6 depicts an example workflow for calculating a coil mixing error matrix that is input into a neural network configured to assess motion according to an embodiment.
Figure 7:
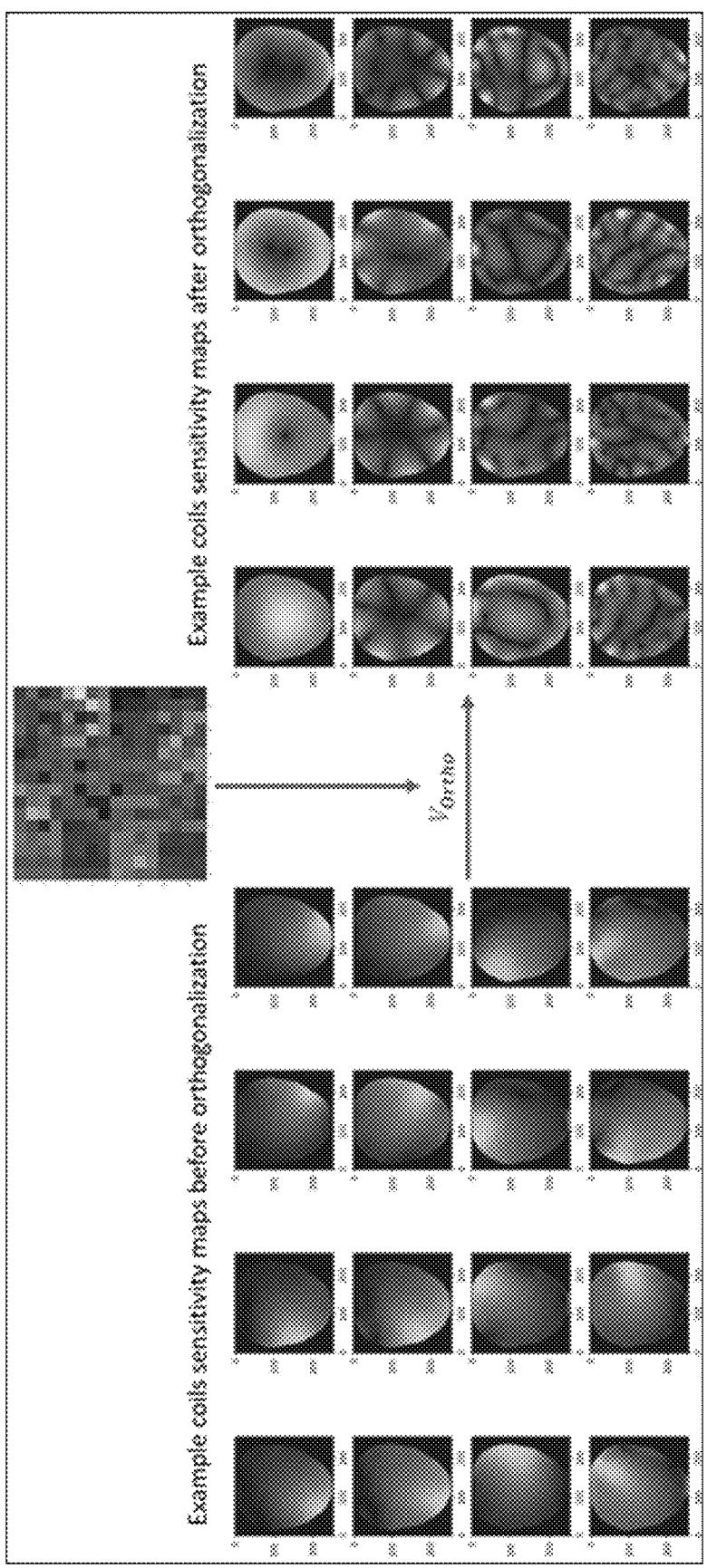
FIG. 7 depicts an example of orthogonalization.

The processor is configured to calculate the CMM and/or CMEM using data from a scout scan and a definitive scan. FIG. 6 depicts an example of the workflow for calculating the CMEM that is then input in the trained neural network. Acquisition of a scout scan is performed. Alternatively, motion free reference data may be generated or derived from other sources, for example, a previous procedure or preliminary scan. A scout coil mixing matrix (scout CMM) is calculated. The scout CMM may be calculated by applying SVD to the scout data. The singular value decomposition (SVD) is used to reduce the dimensions of the raw data $k \in \mathbb{C}^{N \times C}$ along the number of receiver coils C. The SVD creates an orthonormal base of virtual coils that spans the acquired data and sorts them descendent by their singular value i.e., their contribution. FIG. 7 depicts an example of coil sensitivity maps prior to and after orthogonalization. To determine this linear combination of the coils $V \in \mathbb{C}^{C \times C}$, the scout scan $k_{Ref}$ is used: $k_{Ref} = USV^H$.

In the presence of motion, the orthonormal base of $k_{Ref}$ fails to span the new image space efficiently due to the object moving within the sensitivities, creating a change in the coil loadings. If $k_{Ref}$ forms a motion free subset of the motion affected k-space $k_{Mot}$, the coil mixing error matrix (CMEM) $V_{Err,s}$ may be calculated for any subset s, if $s \subset k_{Ref} \wedge s \subset k_{Mot}$: $k_{Ref,s} - k_{Mot,s} = USV_{Err,s}^H$. Apart from the motion intensity, the CMEM may also be affected by the object covered by the subset (k-space position, content) and the sensitivity maps. After being generated or calculate, the CMEM and/or CMM is input into the trained neural network. Additional information related to the scan may also be input into the neural network. In an embodiment, the neural network receives the complex valued CMM and/or CMEM as individual channels as well as the additional information and minimizes the L2 norm during the training.

The processor 22 is configured to train or otherwise configure the neural network to generate a motion assessment, for example, a motion score or a set of motion parameters that include values for respective degree of freedoms describing the 3D motion state of the patient at the time of the acquisition of a chunk of the data relative to an initial position. The neural network may be stored in the memory 24. The memory 24 may be a non-transitory computer readable storage medium storing data representing instructions executable by the processor 22. The instructions for implementing the processes, methods and/or techniques discussed herein are provided on non-transitory computer-readable storage media or memories, such as a cache, buffer, RAM, removable media, hard drive, or other computer readable storage media. Non-transitory computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the instructions set, storage media, processor or processing strategy and may be performed by software, hardware, integrated circuits, firmware, micro code, and the like, operating alone, or in combination. Likewise, processing strategies may include multiprocessing, multitasking, parallel processing, and the like. In one embodiment, the instructions are stored on a removable media device for reading by local or remote systems. In other embodiments, the instructions are stored in a remote location for transfer through a computer network or over telephone lines. In yet other embodiments, the instructions are stored within a given computer, CPU, GPU, or system. The memory 24 may store a model or the neural network.

Figure 8:
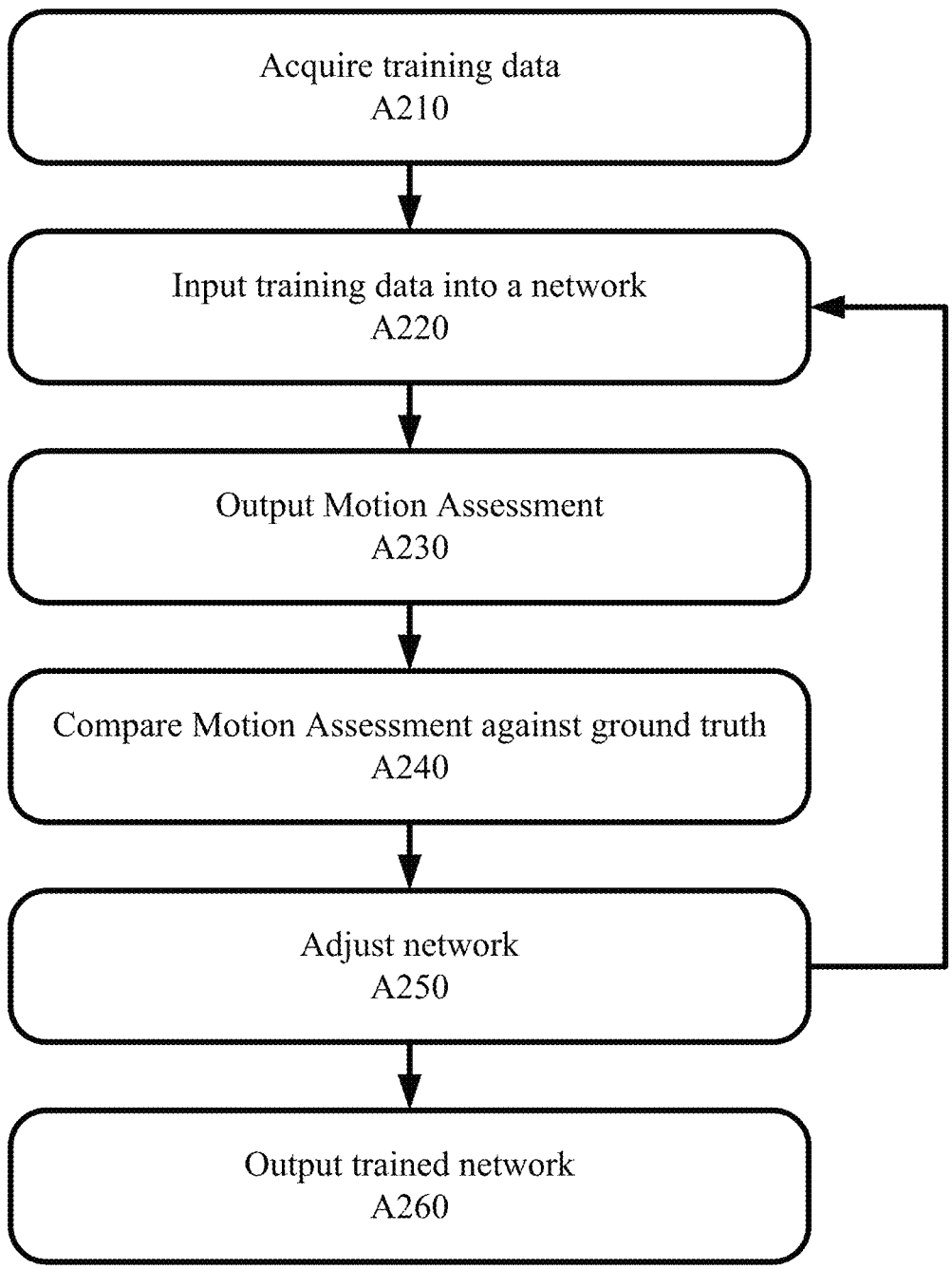
FIG. 8 depicts an example workflow for training a neural network configured to assess motion according to an embodiment.

FIG. 8 depicts an example workflow for training the neural network. At Act A210, the processor 22 is configured to train or configure the neural network using training data stored in, for example, the memory 24. In an embodiment, the training data is labeled, and the neural network is taught using a supervised learning process. A supervised learning process may be used to predict numerical values (regression) and for classification purposes (predicting the appropriate class). A supervised learning processing may include processing images, audio files, videos, numerical data, and text among other types of data. Classification examples include segmentation, object recognition, face recognition, credit risk assessment, voice recognition, and customer churn, among others. Regression examples include determining continuous numerical values on the basis of multiple (sometimes hundreds or thousands) input variables.

The neural network may be any model or network that is trained using a machine learned process. The neural network may include machine learned processes such as support vector machine (SVM), boosted and bagged decision trees, k-nearest neighbor, Naïve Bayes, discriminant analysis, logistic regression, and neural networks. In an example, a two-stage convolutional neural network is used that includes max pooling layers. The two-stage convolutional neural network (CNN) uses rectified linear units for the non-linearity and a fully connected layer at the end.

At act A220, the training data (CMM, CMEM) is input in the neural network. At act A230, the network outputs a motion assessment. In an embodiment, the network is configured to output a motion assessment that describe the extent, type, and/or magnitude of the motion. The motion assessment is compared against the ground truth motion assessment at act A240. At act A250, the network is adjusted, for example, using backpropagation based on the comparison from Act A240. In an embodiment, the neural network is trained using a gradient descent technique or a stochastic process. Gradient descent attempts to minimize an error function for the neural network. Training the neural network involves adjusting internal weights or parameters of the neural network until the neural network is able to accurately predict the correct outcome given a newly input data point. Different loss functions may be used to train the neural network. For example, a L2 norm is calculated as the square root of the sum of the squared vector values.

The training process (Acts A220-A250) repeats for a number of iterations until the parameters converge or a predetermined number of iterations are reached. This process may be repeated hundreds or thousands of times. In an example, several hundred (e.g., 100 to 500) or thousand (e.g., 3,000 to 5,000) iterations may be performed. Depending on the complexity of the neural network and the training data, more or fewer iterations may be performed. If new data is added to the training data, the processor may retrain the neural network. At act A260, a trained network is output. The result of the training process is a neural network that may be able to, for example, accurately predict a motion score for an echo train when input a CMEM (and other information if relevant). The neural network is used on new data to generate, for example, the motion assessment that may be used to determine if reacquisition or replacement is required or beneficial for the image quality. In an embodiment, the network can be trained directly on the first linear combination of the acquired data, i.e., without performing this step again. This is also true if the arrangement of the coils already has similar properties as the first linear combination. A benefit of this approach is the reduced computational complexity, which is important for real-time prospective applications.

The processor 22, server 28, and imaging system 36 may communicate and shared data over a wired or wireless network. The wireless network may be a cellular telephone network, LTE (Long-Term Evolution), 4G LTE, a wireless local area network, such as an 802.11, 802.16, 802.20, WiMax (Worldwide Interoperability for Microwave Access) network, DSRC (otherwise known as WAVE, ITS-G5, or 802.11p and future generations thereof), a 5G wireless network, or wireless short-range network. Further, the network may be a public network, such as the Internet, a private network, such as an intranet, or combinations thereof, and may utilize a variety of networking protocols now available or later developed including, but not limited to transmission control protocol/internet protocol (TCP/IP) based networking protocols.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

What is claimed is:

1. A method for prospective or retrospective motion identification during an acquisition of magnetic resonance (MR) images of a patient by an imaging system, the method comprising:
   acquiring a motion free reference;
   calculating, based on the motion free reference, a first coil mixing matrix representing a linear combination of coils of the imaging system;
   applying the first coil mixing matrix to the motion free reference to generate a linearly combined reference data;
   acquiring MR data for the patient from the imaging system and applying the first coil mixing matrix to the MR data to generate linearly combined motion data;
   determining a second coil mixing matrix for a respective subset of MR data based on the linearly combined motion data;
   inputting the second coil mixing matrix into a neural network trained to output a motion assessment for the acquired MR data; and
   providing the motion assessment generated by the neural network to an operator.

2. The method of claim 1, wherein the motion free reference comprises scout data from a scout procedure acquired prior to acquiring the MR data.

3. The method of claim 1, wherein the first coil mixing matrix is calculated using singular value decomposition.

4. The method of claim 1, wherein additional information comprising at least one a data consistency error of a current echo train, an object size relative to an image matrix size, or a relative energy of the current echo train to a whole is further input into the neural network.

5. The method of claim 1, wherein the linearly combined motion data and the second coil mixing matrix are calculated for each respective echo train of the MR data.

6. The method of claim 1, wherein the motion assessment comprises values for respective degree of freedoms describing a three-dimensional motion state of the patient at a time of an acquisition of a portion of the MR data relative to an initial position.

7. The method of claim 1, wherein the motion assessment comprises at least a motion score for a respective chunk of the MR data.

8. The method of claim 1, further comprising:
   ranking motion scores for each echo train; and
   replacing data for echo train ranked above a certain level.

9. The method of claim 1, further comprising:
   ranking motion scores for each echo train; and
   reacquiring data for echo train ranked above a certain level.

10. A method for prospective or retrospective motion identification during an acquisition of magnetic resonance (MR) images of a patient by an imaging system, the method comprising:
    acquiring a motion free reference;
    calculating, based on the motion free reference, a first coil mixing matrix representing a linear combination of coils of the imaging system;
    acquiring MR data for the patient from the imaging system and applying the first coil mixing matrix to the MR data to generate linearly combined motion data;
    calculating a second coil mixing matrix for a respective subset of MR data based on the linearly combined motion data;
    calculating a difference coil mixing error matrix for a respective subset of MR data based on the difference of the first coil mixing matrix and the second coil mixing matrix;
    inputting the difference coil mixing error matrix into a neural network trained to output a motion assessment for the acquired MR data; and
    providing the motion assessment generated by the neural network to an operator.

11. The method of claim 10, wherein the motion free reference comprises scout data from a scout procedure acquired prior to acquiring the MR data.

12. The method of claim 10, wherein the first coil mixing matrix is calculated using singular value decomposition.

13. The method of claim 10, wherein additional information comprising at least one a data consistency error of a current echo train, an object size relative to an image matrix size, or a relative energy of the current echo train to a whole is further input into the neural network.

14. The method of claim 10, wherein the motion assessment comprises values for respective degree of freedoms describing a three-dimensional motion state of the patient at a time of an acquisition of a portion of the MR data relative to an initial position.

15. The method of claim 10, wherein the motion assessment comprises at least a motion score for a respective chunk of the MR data.

16. The method of claim 10, further comprising:
    ranking motion scores for each echo train; and
    replacing data for echo train ranked above a certain level.

17. The method of claim 10, further comprising:
    ranking motion scores for each echo train; and reacquiring data for echo train ranked above a certain level.

18. A system for prospective or retrospective motion identification during an acquisition of magnetic resonance data of a patient, the system comprising:
- a magnetic resonance imaging system configured to acquire motion free reference data and magnetic resonance data;
- a processor configured to calculate, based on the motion free reference data, a scout coil mixing matrix and to calculate, based on the scout coil mixing matrix and the magnetic resonance data, a coil mixing error matrix, a coil mixing matrix, or the coil mixing error matrix and the coil mixing matrix;
- a neural network configured to output a motion assessment when input the coil mixing error matrix, the coil mixing matrix, or the coil mixing error matrix and the coil mixing matrix; and
- an output device configured to output the motion assessment from the neural network during an imaging procedure for the acquisition of the magnetic resonance data.

19. The system of claim 18, wherein the motion assessment comprises values for respective degree of freedoms describing a three-dimensional motion state of the patient at a time of an acquisition of a portion of the MR data relative to an initial position.

20. The system of claim 18, wherein the motion assessment comprises at least a motion score for a respective chunk of the MR data.

* * * * *